(12) United States Patent
Zhang et al.

(10) Patent No.: US 10,670,668 B2
(45) Date of Patent: *Jun. 2, 2020

(54) ELECTRONIC DEVICE

(71) Applicant: GUANGDONG OPPO MOBILE TELECOMMUNICATIONS CORP., LTD., Dongguan, Guangdong (CN)

(72) Inventors: Jialiang Zhang, Guangdong (CN); Kewei Wu, Guangdong (CN); Jie Wu, Guangdong (CN); Xingwei Yuan, Guangdong (CN); Feiwu Shuai, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,656

(22) Filed: Aug. 23, 2018

(65) Prior Publication Data
US 2018/0364291 A1    Dec. 20, 2018

Related U.S. Application Data

(63) Continuation of application No. 15/114,966, filed as application No. PCT/CN2014/077046 on May 8, 2014, now Pat. No. 10,082,532.

(30) Foreign Application Priority Data

Jan. 28, 2014  (CN) .......................... 2014 1 0042716

(51) Int. Cl.
*G01R 31/68* (2020.01)
*H04M 1/24* (2006.01)
(Continued)

(52) U.S. Cl.
CPC ............ *G01R 31/68* (2020.01); *G06F 11/221* (2013.01); *H04M 1/24* (2013.01);
(Continued)

(58) Field of Classification Search
CPC ......... H02J 2007/0062; G06F 11/2247; G01R 31/04
See application file for complete search history.

(56) References Cited

U.S. PATENT DOCUMENTS 6,086,430 A * 7/2000 Amoni ................. H01R 13/645
439/639
6,356,582 B1 * 3/2002 Mazer ................. G06F 13/4072
375/219

(Continued)

FOREIGN PATENT DOCUMENTS

CN    101174713 A    5/2008
CN    101751316 A    6/2010
(Continued)

OTHER PUBLICATIONS

Park et al., Maximum Power Transfer Tracking in a Solar USB Charger for Smartphones, Symposium on Low Power Electronics and Design, Sep. 4, 2013, pp. 88-93.

(Continued)

*Primary Examiner* — Alvaro E Fortich
(74) *Attorney, Agent, or Firm* — Lathrop GPM LLP (57) ABSTRACT

The present disclosure provides an electronic device. The electronic device includes: a USB interface, including a first power wire and a signal wire, in which the USB interface is configured to receive a power signal via the signal wire, when the USB interface is coupled to a second electronic device, the first power wire is configured to output the power signal received to the second electronic device, and the signal wire is configured to acquire a voltage of a power wire (Continued)

of the second electronic device; a controller, configured to acquire the voltage of the first power wire and a voltage of the signal wire in the USB interface through a coupling between the USB interface and the second electronic device, to determine whether the interface coupling is abnormal according to the voltage difference.

12 Claims, 4 Drawing Sheets

(51) Int. Cl.
*H04M 1/725* (2006.01)
*G06F 11/22* (2006.01)
*H02J 7/00* (2006.01)
*G01R 31/66* (2020.01)

(52) U.S. Cl.
CPC ......... *H04M 1/72527* (2013.01); *G01R 31/66* (2020.01); *G06F 11/2247* (2013.01); *H02J 7/00* (2013.01)

(56) References Cited

U.S. PATENT DOCUMENTS

| | | | |
|---|---|---|---|
| 8,024,491 B1 | 9/2011 | Wright et al. | |
| 8,430,690 B2 * | 4/2013 | Su | H05K 5/0278 439/607.01 |
| 8,626,932 B2 * | 1/2014 | Lydon | G06F 13/385 709/228 |
| 2008/0140885 A1 | 6/2008 | Collins | |
| 2012/0300516 A1 * | 11/2012 | Chen | H02M 3/28 363/78 |
| 2013/0132746 A1 | 5/2013 | Chen et al. | |
| 2014/0013012 A1 | 1/2014 | Terlizzi et al. | |

FOREIGN PATENT DOCUMENTS

| | | | |
|---|---|---|---|
| CN | 102479133 A | 5/2012 | |
| CN | 102479137 A | 5/2012 | |
| JP | 2013243789 | * 12/2013 | H02M 3/28 |
| JP | 2013243789 A | 12/2013 | |

OTHER PUBLICATIONS

European Patent Application 18190800.5 partial Search and Opinion dated Oct. 8, 2018, 15 pages.
Texas Instruments; MCPC Compatible USB Port Multimedia Switch Supports USB, UART, Audio, ID, MIC, and Load Switch; Jun. 30, 2013, 40 pages.
European Patent Application 18190800.5 extended Search and Opinion dated Jan. 7, 2019, 15 pages.
Chinese Patent Application No. 201810284623.4 Office Action dated Aug. 29, 2019, 8 pages.
Chinese Patent Application No. 201810284623.4 English translation of Office Action dated Aug. 29, 2019, 8 pages.

* cited by examiner

ELECTRONIC DEVICE

RELATED APPLICATIONS

This application is a continuation of pending U.S. application Ser. No. 15/114,966 filed on Jul. 28, 2016, which is a National Phase Application of International Application No. PCT/CN2014/077046, filed on May 8, 2014, which is based on and claims priority to Chinese Patent Application No. 201410042716.8, filed on Jan. 28, 2014, the entire contents of which are incorporated herein by reference.

TECHNICAL FIELD

The present disclosure generally relates to the mobile terminal field, and more particularly, to an electronic device.

BACKGROUND

With the progress of the times, the internet and mobile communication network provide massive functions and applications. A user not only can use a mobile terminal to perform conventional applications, such as use a smart phone to answer a call or call somebody up, but also can use the mobile terminal to browse a webpage, transmit a picture or play a game and so on.

When the mobile terminal is used to handle matters, a huge quantity of electricity in a cell of the mobile terminal is consumed due to the increased usage frequency of the mobile terminal, such that it is required to charge the mobile terminal frequently. Since the pace of life becomes more and more fast, particularly, emergencies become more and more frequent, the user wants to charge the cell of the mobile terminal with large current.

With the increasing usage frequency of the mobile terminal, it is required to charge the mobile terminal frequently. If the mobile terminal is charged anomalously due to an abnormal USB interface coupling, it is easy to cause a safety accident, which may damage the USB interface, the mobile terminal or the charging adapter, or even cause a fire. Therefore, there is a need to detect whether there is the USB interface coupling is abnormal after the USB interfaces are coupled.

SUMMARY

Embodiments of the present disclosure provide an electronic device. The electronic device includes:

a USB interface, including a first power wire and a signal wire, wherein the USB interface is configured to receive a power signal via the signal wire, when the USB interface is coupled to a second electronic device, the first power wire is configured to output the power signal received to the second electronic device, and the signal wire is configured to acquire a voltage of a power wire of the second electronic device;

a controller, including a first voltage sampling end coupled to a power end of the first power wire in the USB interface, and a second voltage sampling end coupled to a signal end of the signal wire in the USB interface; and configured to acquire the voltage of the first power wire and a voltage of the signal wire in the USB interface through a coupling between the USB interface and the second electronic device, to calculate a voltage difference between the voltage of the first power wire and the voltage of the signal wire, and to determine whether the interface coupling is abnormal according to the voltage difference.

BRIEF DESCRIPTION OF THE DRAWINGS

In order to make the technical solutions of embodiments of the present invention more clearly, the accompanying drawings used in the description of embodiments of the present invention are briefly described hereunder. Obviously, the described drawings are merely some embodiments of present invention. For persons skilled in the art, other drawings may be obtained based on these drawings without any creative work.

DETAILED DESCRIPTION

To make the objectives, the technical solutions, and the advantages of embodiments of the present invention clearer, the technical solutions in embodiments of the present invention are hereinafter described clearly and completely with reference to the accompanying drawings in embodiments of the present invention. Apparently, the described embodiments are explanatory, illustrative, and used to generally understand the present disclosure. The embodiments shall not be construed to limit the present disclosure. In order to explain the technical solutions of the present disclosure, specific embodiments will be described as follows.

It should be noted that, a charging adapter in embodiments of the present disclosure includes a terminal capable of outputting a power signal to charge a cell (a cell of a mobile terminal), such as a power adapter, a charger, an IPAD and a smart phone.

It should be noted that, "first" used in "first USB interface", "first power wire", "first ground wire" and "first signal wire" is used herein for purposes of description, "second" used in "second USB interface", "second power wire", "second ground wire" and "second signal wire" is also used herein for purposes of description.

Figure 1:
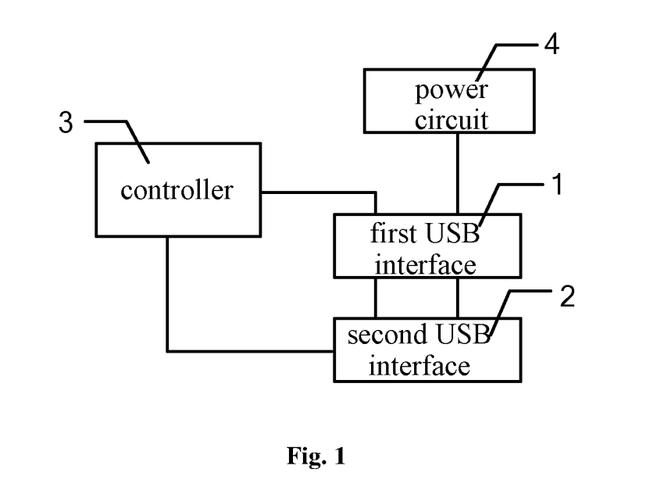
FIG. 1 is a schematic diagram of a detection circuit for detecting an abnormal interface coupling according to an embodiment of the present disclosure.

In an embodiment of the present disclosure, when a charging adapter is used to charge a mobile terminal, it is required to detect whether a coupling between the first USB interface 1 and the second USB interface 2 is abnormal, especially, whether a first power wire in the first USB interface 1 is well coupled with a second power wire in the second USB interface 2. If the coupling is abnormal, then the mobile terminal is not charged. The mobile terminal is charged, particularly with large current (3 A or greater than 3 A), only when the coupling is normal, especially when the first power wire in the first USB interface 1 is well coupled with the second power wire in the second USB interface 2 and a first ground wire in the first USB interface 1 is well coupled with a second ground wire in the second USB interface 2.

FIG. 1 shows a specific diagram of a detection circuit for detecting an abnormal interface coupling according to an embodiment of the present disclosure. For facilitating the explanation, only parts related to this embodiment of the present disclosure are shown, which may be described as follows.

As shown in FIG. 1, the detection circuit includes a power circuit 4, and further includes a first USB interface 1, a second USB interface 2 and a controller 3.

The first USB interface 1 includes a first power wire and a first signal wire. A power end of the first power wire is coupled with the power circuit 4.

The second USB interface 2 includes a second power wire and a second signal wire. The second USB interface 2 is coupled with the first USB interface 1, such that the second signal wire is coupled with the first signal wire.

The first power wire is configured to receive a power signal outputted by the power circuit 4, and to output the power signal received to the second power wire in the second USB interface 2 coupled with the first USB interface 1.

The controller 3 is configured to acquire a voltage difference between a voltage of the first power wire and a voltage of the second power wire, and to determine whether the interface coupling is abnormal according to the voltage difference.

Figure 2:
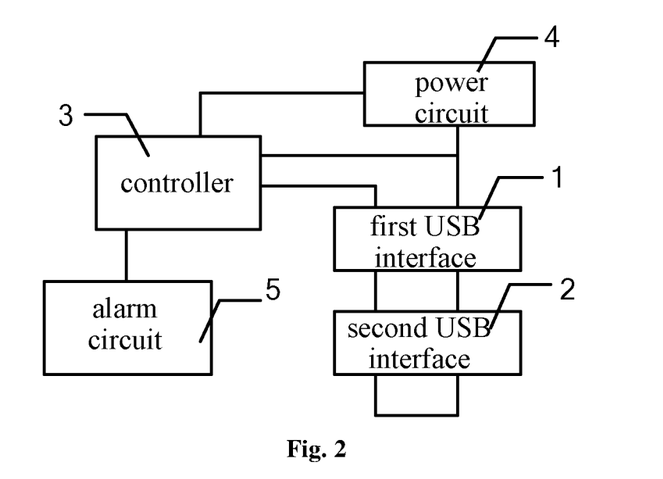
FIG. 2 is a schematic diagram of a detection circuit for detecting an abnormal interface coupling according to another embodiment of the present disclosure.

FIG. 2 shows a schematic diagram of a detection circuit for detecting an abnormal interface coupling according to an embodiment of the present disclosure. For facilitating the explanation, only parts related to this embodiment of the present disclosure are shown, which may be described as follows.

In this embodiment, the second power wire and the second signal wire are short-circuited coupled. The power end of the first power wire is coupled to a first voltage sampling end of the controller 3. A signal end of the first signal wire is coupled to a second voltage sampling end of the controller 3. The controller 3 is configured to acquire the voltage of the first power wire from the first voltage sampling end, to acquire a voltage of the first signal wire from the second voltage sampling end, and to calculate the voltage difference according to the voltage of the first power wire and the voltage of the first signal wire.

Since a signal wire transmits a signal with small current, when the first USB interface 1 is coupled with the second USB interface 2, it may be considered that the voltage of the first signal wire in the first USB interface 1 is approximately equal to the voltage of the second signal wire in the second USB interface 2, as long as the first signal wire in the first USB interface 1 is coupled with the second signal wire in the second USB interface 2, even though the coupling between the first signal wire in the first USB interface 1 and the second signal wire in the second USB interface 2 is not good enough.

Further, the controller 3 acquires the voltage of the first power wire in the first USB interface 1 from the first voltage sampling end, and acquires the voltage of the first signal wire in the first USB interface 1 from the second voltage sampling end. Since the second power wire and the second signal wire in the second USB interface 2 are short-circuited coupled, the voltage of the first signal wire acquired by the controller 3 is also the voltage of the second power wire in the second USB interface 2, such that the voltage difference (the voltage difference between the voltage of the first power wire and the voltage of the first signal wire) calculated by the controller 3 is also the voltage difference between the voltage of the first power wire in the first USB interface 1 and the voltage of the second power wire in the second USB interface 2.

Further, the controller 3 may determine whether the first power wire in the first USB interface 1 is well coupled with the second power wire in the second USB interface 2 according to the voltage difference between the voltage of the first power wire and the voltage of the first signal wire. Specifically, if the voltage difference between the voltage of the first power wire and the voltage of the first signal wire is less than or equal to a preset voltage threshold, it means that the first power wire in the first USB interface 1 is well coupled with the second power wire in the second USB interface 2, such that the cell of the mobile terminal may be charged. If the voltage difference between the voltage of the first power wire and the voltage of the first signal wire is greater than the preset voltage threshold, it means that the first power wire in the first USB interface 1 is not well coupled with the second power wire in the second USB interface 2, such that the cell of the mobile terminal cannot be charged. In at least one embodiment, if the voltage difference between the voltage of the first power wire and the voltage of the first signal wire is greater than the preset voltage threshold, the controller 3 sends a detection stop instruction to the power circuit 4, so as to control the power circuit 4 to stop outputting the power signal to the first power wire in the first USB interface 1.

It should be noted that, the preset voltage threshold is set at least according to the following values: the voltage difference between the voltage of the first power wire and the voltage of the first signal wire calculated when the first power wire in the first USB interface 1 is well coupled with the second power wire in the second USB interface 2, and the current outputted by the power circuit 4 to the second power wire via the first power wire when the coupling is detected.

In this embodiment, before the cell of the mobile terminal is charged, the coupling between the first USB interface 1 and the second USB interface 2 is detected, and only if the first USB interface is well coupled with the second USB interface 2 (i.e. the first power wire is well coupled with the second power wire), the cell of the mobile terminal can be charged.

In at least one embodiment, even though the cell of the mobile terminal is charged since the coupling between the first USB interface 1 and the second USB interface 2 is good at first, the controller 3 still acquires the voltage of the first power wire and the voltage of the first signal wire in the first USB interface 1 respectively in real time, calculates the voltage difference between the voltage of the first power wire and the voltage of the first signal wire in real time, and determines whether the coupling is abnormal according to the voltage difference in real time. If the coupling is abnormal, the controller 3 may send a detection stop instruction to the power circuit 4 in time, so as to control the power circuit 4 to stop outputting the power signal to the first power wire in the first USB interface 1.

In another embodiment of the present disclosure, the detection circuit further includes an alarm circuit 5.

A controlled end of the alarm circuit 5 is coupled with a control end of the controller 3. If the voltage difference between the voltage of the first power wire in the first USB interface 1 and the voltage in the first signal wire in the first USB interface 1 is greater than the preset voltage threshold, the alarm circuit 5 receives a prompt instruction sent from the controller 3 and issues the alarm.

Thus, if the first power wire in the first USB interface 1 is not well coupled with the second power wire in the second USB interface 2, the voltage difference between the voltage of first power wire in the first USB interface 1 and the voltage of the first signal wire in the first USB interface 1 is greater than the preset voltage threshold, such that the controller 3 controls the power circuit 4 to stop outputting the power signal to the first power wire in the first USB interface 1, and meanwhile sends a prompt instruction to the alarm circuit 5, and then the alarm circuit 5 issues the alarm. In at least one embodiment, the alarm circuit 5 may issue the alarm by the following ways of: controlling an LED light to illumine or flash, and/or controlling a speaker to make sound and so on.

It should be noted that, if there is a need to charge the mobile terminal by a charging adapter, it is required to couple a USB plug included in the charging adapter with a USB socket included in the mobile terminal, such that the cell of the mobile terminal is charged after the detection circuit for detecting an abnormal interface coupling detects that the USB plug is well coupled with the USB socket.

In another embodiment of the present disclosure, the first USB interface 1 is a USB socket, and the power circuit 4, the first USB interface 1 and the controller 3 are included in the mobile terminal.

The second USB interface 2 is a USB plug, and the second USB interface 2 is included in the charging adapter.

In this way, it may be detected by the mobile terminal whether the first power wire in the first USB interface 1 is well coupled with the second power wire in the second USB interface 2.

In another embodiment of the present disclosure, the first USB interface 1 is a USB plug, and the power circuit 4, the first USB interface 1 and the controller 3 are included in the charging adapter.

The second USB interface 2 is a USB socket, and the second USB interface 2 is included in the mobile terminal.

In this way, it may be detected by the charging adapter whether the first power wire in the first USB interface 1 is well coupled with the second power wire in the second USB interface 2.

In another embodiment of the present disclosure, the number of the first power wires in the first USB interface 1 is P, and P is greater than or equal to 2.

The first USB interface 1 further includes Q first ground wires, and Q is greater than or equal to 2.

It should be noted that, since a MICRO USB interface in an existing mobile terminal only includes one power wire and one ground wire, the mobile terminal is charged only through one charging loop formed by one power path and one ground path when the mobile terminal is charged via the MICRO USB interface, such that the maximum charging current supported is just 3 A, and therefore the charging is slow and wastes time.

On the basis of this, the first USB interface 1 provided by an embodiment of the present disclosure includes P first power wires and Q first ground wires, such that if there are at least two second power wires and at least two ground wires in the second USB interface 2, at least two charging loops may be formed when the first USB interface 1 is coupled with the second USB interface 2, and thus the charging current at least greater than 3 A may be supported. In addition, if the second USB interface 2 is a common MICRO USB interface, it can be compatible with the first USB interface 1 above and the charging may be performed.

In another embodiment of the present disclosure, the number of the second power wires in the second USB interface 2 is M, and M is greater than or equal to 2.

The second USB interface 2 further includes N second ground wires, and N is greater than or equal to 2.

Similarly, the second USB interface 2 provided by an embodiment of the present disclosure includes M second power wires and N second ground wires, such that if there are at least two first power wires and at least two first ground wires in the first USB interface 1, at least two charging loops may be formed when the first USB interface 1 is coupled with the second USB interface 2, and thus the charging current at least greater than 3 A may be supported. In addition, if the first USB interface 1 is a common MICRO USB interface, it can be compatible with the second USB interface 2 above and the charging may be performed.

In another embodiment of the present disclosure, P, M, Q and N are identical to each other.

The first power wire included in the first USB interface is made of chromium bronze C18400 or phosphor bronze C7025, the first ground wire included in the first USB interface is made of chromium bronze C18400 or phosphor bronze C7025, the second power wire included in the second USB interface is made of chromium bronze C18400 or phosphor bronze C7025, and the second ground wire included in the second USB interface is made of chromium bronze C18400 or phosphor bronze C7025.

It should be noted that, each of the power wire and the ground wire in the existing MICRO USB interface is made of metal copper foil with conductivity less than 20%. However, each of the first power wire and the first ground wire included in the first USB interface 1, the second power wire and the second ground wire included in the second USB interface 2 is made of phosphor bronze C7025 with conductivity reaching 50%, such that the charging current may be further increased in the case that the cell of mobile terminal is charged using at least two charging loops (including at least two first power wires, at least two first ground wires, at least two second power wires and at least two second ground wires). In at least one embodiment, each of the first power wire and the first ground wire included in the first USB interface 1, the second power wire and the second ground wire included in the second USB interface 2 is made of chromium bronze C18400 with conductivity reaching 70%, which may further increases the charging current.

Figure 3:
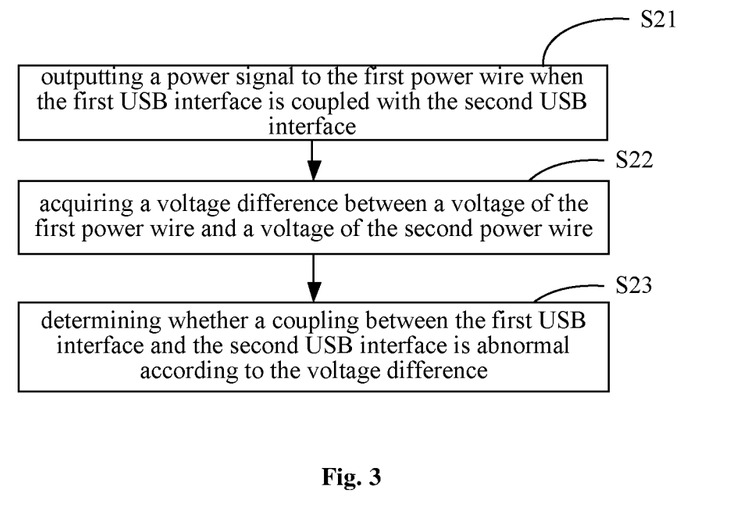
FIG. 3 is a first flow chart showing a method for detecting an abnormal interface coupling according to an embodiment of the present disclosure.

FIG. 3 shows a first flow chart of a method for detecting an abnormal interface coupling according to an embodiment of the present disclosure. For facilitating the explanation, only parts related to this embodiment of the present disclosure are shown, which may be described as follows.

It should be noted that, the interface coupling detection method provided by an embodiment of the present disclosure and the interface coupling detection circuit provided by an embodiment of the present disclosure are adaptable to each other.

The method for detecting an abnormal interface coupling provided by an embodiment of the present disclosure may be applied in a detection circuit for detecting an abnormal coupling including a controller, a first USB interface, a second USB interface and a power circuit 4. When the first USB interface is coupled with the second USB interface, a first signal wire in the first USB interface is coupled with a second signal wire in the second USB interface. The method for detecting an abnormal interface coupling includes following blocks.

In block S21, the power circuit outputs a power signal to the first power wire when the first USB interface is coupled with the second USB interface, such that the first USB interface outputs the power signal to the second power wire in the second USB interface via the first power wire.

In block S22, a voltage difference between a voltage of the first power wire and a voltage of the second power wire is acquired.

In block S23, it is determined whether the interface coupling is abnormal according to the voltage difference.

Figure 4:
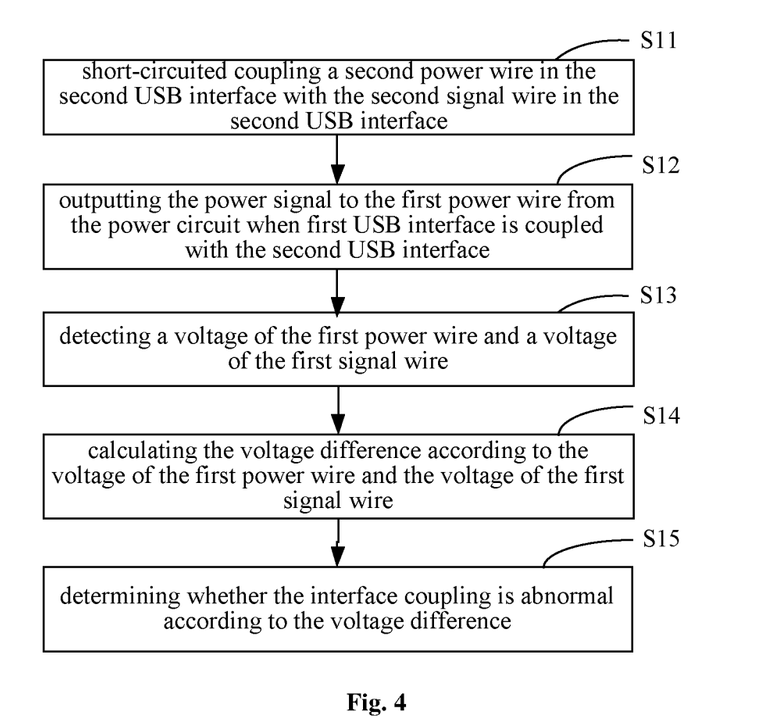
FIG. 4 is a second flow chart showing a method for detecting an abnormal interface coupling according to an embodiment of the present disclosure.

FIG. 4 is a second flow chart of a method for detecting an abnormal interface coupling according to an embodiment of the present disclosure. As shown in FIG. 4, the method in this embodiment includes following blocks.

In block S11, the second power wire in the second USB interface and the second signal wire in the second USB interface are short-circuited coupled.

In block S12, the power circuit outputs the power signal to the first power wire when the first USB interface is coupled with the second USB interface, such that the first USB interface outputs the power signal to the second power wire in the second USB interface via the first power wire.

In block S13, the controller detects a voltage of the first power wire in the first USB interface and a voltage of the first signal wire in the first USB interface.

In block S14, the controller calculates the voltage difference according to the voltage of the first power wire and the voltage of the first signal wire.

In block S15, the controller determines whether the coupling between the first USB interface and the second USB interface is abnormal according to the voltage difference.

In at least one embodiment, if the voltage difference is less than or equal to a preset voltage threshold, it is determined that the interface coupling is normal, and if the voltage difference is greater than the preset voltage threshold, it is determined that the interface coupling is abnormal.

It should be noted that, if a charging adapter is used to charge the mobile terminal, the user may couple the first USB interface with the second USB interface. As long as the first signal wire is not disconnected from (i.e., coupled to) the second signal wire, it can be considered that the voltage of the first signal wire in the first USB interface is approximately equal to the voltage of the second signal wire in the second USB interface.

When the controller acquires the voltage of the first power wire and the voltage of the first signal wire in the first USB interface, the voltage of the first signal wire acquired by the controller is also the voltage of the second power wire in the second USB interface since the second power wire and the second signal wire in the second USB interface are short-circuited coupled, such that the voltage difference (the voltage difference between the voltage of the first power wire and the voltage of the first signal wire) calculated by the controller is also the voltage difference between the voltage of the first power wire in the first USB interface and the voltage of the second power wire in the second USB interface.

Thus, the controller may determine whether the coupling between the first power wire in the first USB interface and the second power wire in the second USB interface is abnormal according to the voltage difference between the voltage of the first power wire and the voltage of the first signal wire, and thus determine whether the coupling between the first USB interface and the second USB interface is abnormal.

If the coupling between the first USB interface and the second USB interface is normal, the cell of the mobile is charged.

Figure 5:
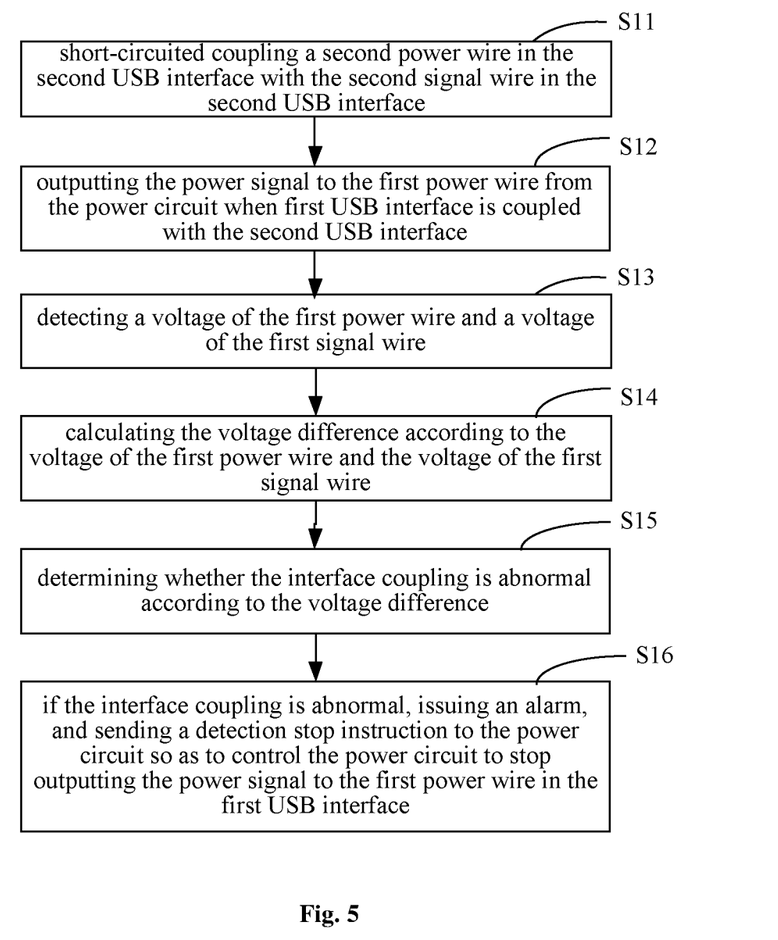
FIG. 5 is a third flow chart showing a method for detecting an abnormal interface coupling according to an embodiment of the present disclosure.

FIG. 5 shows a third flow chart of a method for detecting an abnormal interface coupling according to an embodiment of the present disclosure. For facilitating the explanation, only parts related to this embodiment of the present disclosure are shown, which may be described as follows.

In another embodiment of the present disclosure, the method for detecting the abnormal interface coupling further includes the following block.

In block S16, if the voltage difference between the voltage of the first power wire in the first USB interface and the voltage of the first signal wire in the first USB interface is greater than the preset voltage threshold, the controller controls an alarm circuit to issue an alarm, and sends a detection stop instruction to the power circuit so as to control the power circuit to stop outputting the power signal to the first power wire in the first USB interface.

In this way, either when the first USB interface is being coupled with the second USB interface or when the charging is being performed after the interface coupling is detected, the controller controls the power circuit to stop outputting the power signal to the first power wire in the first USB interface and controls the alarm circuit to issue the alarm once the voltage difference between the voltage of the first power wire and the voltage of the first signal wire in the first USB interface is greater than the preset voltage threshold, so as to avoid the damage of USB interface (the first USB interface and the second USB interface) due to an abnormal coupling.

Figure 6:
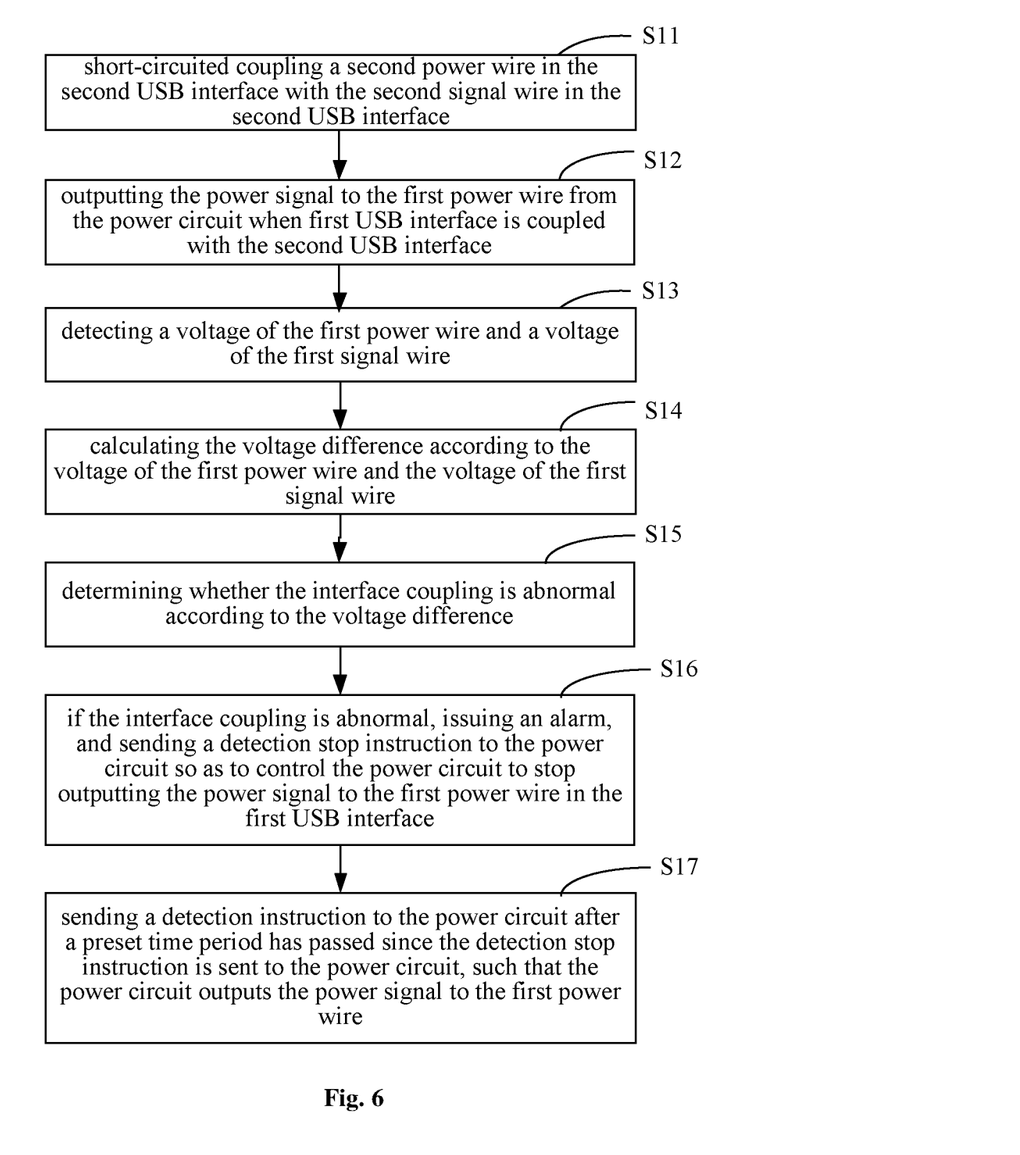
FIG. 6 is a fourth flow chart showing a method for detecting an abnormal interface coupling according to an embodiment of the present disclosure.

FIG. 6 shows a fourth flow chart of a method for detecting an abnormal interface coupling according to an embodiment of the present disclosure. For facilitating the explanation, only parts related to this embodiment of the present disclosure are shown, which may be described as follows.

In another embodiment of the present disclosure, after the controller controls the alarm circuit to issue the alarm, the method for detecting the abnormal interface coupling further includes the following step.

In block S17, the controller sends a detection instruction to the power circuit after a preset time period has passed since the detection stop instruction is sent, such that the power circuit outputs the power signal to the first power wire in the first USB interface.

Specifically, when an abnormal coupling occurs, the user may couple the first USB interface with the second USB interface again after the alarm circuit has issued the alarm. Accordingly, after the power circuit stops outputting the power signal to the first power wire in the first USB interface, the controller sends the detection instruction to the power circuit every the preset time period, such that the power circuit outputs the power signal to the first power wire in the first USB interface, and the controller acquires the voltage of the first power wire in the first USB interface and the voltage of the second power wire in the second USB interface again and calculates the voltage difference, and determines whether the first power wire in the first USB interface is well coupled with the second power wire in the second USB interface according to the voltage difference.

In conclusion, the charging is performed, particularly with large current (greater than 3 A), only if the first USB interface is well coupled with the second USB interface.

The embodiments described hereinabove are only preferred embodiments of the present application, and should not be interpreted as limitation to the present application. For the persons skilled in the art, various variations and modifications may be made to the present application. Any modifications, equivalent replacements and improvements made within the spirit and principle of the present application are also deemed to fall into the protection scope of the present application.

What is claimed is:

1. An electronic device, comprising:
   a USB interface, comprising a first power wire and a signal wire, wherein the USB interface is configured to receive a power signal via the signal wire, when the USB interface is coupled to a second electronic device, the first power wire is configured to output the power signal received to the second electronic device, and the signal wire is configured to acquire a voltage of another power wire of the second electronic device; and
   a controller, comprising a first voltage sampling end coupled to a power end of the first power wire in the USB interface, and a second voltage sampling end coupled to a signal end of the signal wire in the USB interface; and configured to acquire a power-wire voltage of the first power wire and a signal-wire voltage of the signal wire in the USB interface through a coupling between the USB interface and the second electronic device, to calculate a voltage difference between the power-wire voltage of the first power wire and the signal-wire voltage of the signal wire in the USB interface, and to determine whether coupling between the USB interface and the second electronic device is abnormal according to the voltage difference.

2. The electronic device according to claim 1, wherein, the controller is further configured to send a detection stop instruction if the voltage difference between the power-wire voltage of the first power wire and the signal-wire voltage of the signal wire is greater than a preset voltage threshold, so as to control the power signal to stop being output to the first power wire in the USB interface.

3. The electronic device according to claim 1, further comprising:
   an alarm circuit, comprising a controlled end coupled to a control end of the controller; and configured to receive a prompt instruction sent by the controller and to issue an alarm, if the voltage difference between the power-wire voltage of the first power wire and the signal-wire voltage of the signal wire is greater than the preset voltage threshold.

4. The electronic device according to claim 2, wherein, the controller is further configured to send a detection instruction after a preset time period has passed since the detection stop instruction is sent, such that the power signal is output to the first power wire.

5. The electronic device according to claim 1, wherein, the controller is further configured to determine whether the coupling between the USB interface and the second electronic device is abnormal before a charging is performed.

6. The electronic device according to claim 5, wherein, the controller is further configured to continue to determine whether the coupling between the USB interface and the second electronic device is abnormal during the charging.

7. The electronic device according to claim 1, wherein, the USB interface comprises P first power wires, where P is greater than or equal to 2; and
   the USB interface further comprises Q first ground wires, where Q is greater than or equal to 2.

8. The electronic device according to claim 7, wherein P is identical to Q.

9. The electronic device according to claim 7,
   in response to the electronic device being a mobile terminal, the second electronic device is a charging adapter corresponding to the mobile terminal;
   in response to the electronic device being the charging adapter, the second electronic device is the mobile terminal corresponding to the charging adapter.

10. The electronic device according to claim 9,
    in response to the charging adapter being a common charging adapter, the common charging adapter comprising one second power wire and one second ground wire, wherein one charging loop is formed by the second power wire and the second ground wire when a mobile terminal is coupled to the common charging adapter.

11. The electronic device according to claim 9,
    in response to the charging adapter being a quick charging adapter, the quick charging adapter comprising M second power wires and N second ground wires, wherein at least two charging loops are formed by P first power wires and Q first ground wires of a mobile terminal and the M second power wires and the N second ground wires, the second power wire and the ground wire when the mobile terminal is coupled to the quick charging adapter, where P is greater than or equal to 2, Q is greater than or equal to 2, M is greater than or equal to 2, and N is greater than or equal to 2.

12. The electronic device according to claim 1, wherein P, M, Q and N are identical to each other.

* * * * *